United States Patent
Vityaev

(10) Patent No.: US 7,426,676 B2
(45) Date of Patent: Sep. 16, 2008

(54) DATA RETRIEVAL FROM A STORAGE DEVICE USING A COMBINED ERROR CORRECTION AND DETECTION APPROACH

(75) Inventor: Andrei Vityaev, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 604 days.

(21) Appl. No.: 10/757,260

(22) Filed: Jan. 14, 2004

(65) Prior Publication Data

US 2005/0154964 A1 Jul. 14, 2005

(51) Int. Cl.
*H03M 13/15* (2006.01)

(52) U.S. Cl. .................... 714/769; 714/758; 714/781

(58) Field of Classification Search .................. 714/755, 714/781, 758, 769, 756, 784
See application file for complete search history.

(56) References Cited

U.S. PATENT DOCUMENTS

| | | | | |
|---|---|---|---|---|
| 4,413,339 A | * | 11/1983 | Riggle et al. ................. | 714/765 |
| 4,604,748 A | | 8/1986 | Sato | |
| 4,667,326 A | | 5/1987 | Young et al. | |
| 4,782,490 A | * | 11/1988 | Tenengolts ................... | 714/756 |
| 4,916,702 A | * | 4/1990 | Berlekamp .................. | 714/762 |
| 5,241,546 A | | 8/1993 | Peterson et al. | |
| 5,465,260 A | * | 11/1995 | Zook .......................... | 714/758 |
| 5,539,755 A | * | 7/1996 | Baggen ....................... | 714/779 |
| 5,629,949 A | | 5/1997 | Zook | |
| 5,657,331 A | * | 8/1997 | Metzner et al. .............. | 714/762 |
| 5,778,009 A | * | 7/1998 | Fredrickson et al. ........ | 714/752 |
| 5,822,336 A | * | 10/1998 | Weng et al. .................. | 714/784 |
| 5,872,799 A | * | 2/1999 | Lee et al. ..................... | 714/755 |
| 5,948,117 A | * | 9/1999 | Weng et al. .................. | 714/784 |
| 6,058,500 A | * | 5/2000 | DesJardins et al. .......... | 714/781 |
| 6,363,511 B1 | * | 3/2002 | Massoudi .................... | 714/755 |
| 6,446,234 B1 | * | 9/2002 | Cox et al. .................... | 714/758 |
| 6,615,387 B1 | * | 9/2003 | Williamson et al. ......... | 714/785 |
| 6,671,850 B1 | | 12/2003 | Cox et al. | |
| 6,978,415 B1 | * | 12/2005 | Weng .......................... | 714/781 |
| 2002/0178419 A1 | | 11/2002 | Wilhelmsson et al. | |

FOREIGN PATENT DOCUMENTS

EP 0571019 A 11/1993

OTHER PUBLICATIONS

Burton, H., et al., "Cyclic Product Codes", IEEE Transactions on Information Theory, Jul. 1965, pp. 433-439.*

(Continued)

*Primary Examiner*—Stephen M. Baker
(74) *Attorney, Agent, or Firm*—McAndrews, Held & Malloy, Ltd.

(57) ABSTRACT

One or more methods and systems of effectively retrieving data stored in a media of a storage device are presented. The one or more methods and systems are implemented by way of correcting and detecting errors using a multi-stage decoding process. In one embodiment, the storage device comprises a magnetic hard drive. In one embodiment, the system and method applies an encoding/decoding technique that allows error correction and detection to be performed over a number of successive decode stages or processing stages. Use of the system and method increases the maximum number of symbol errors that may be corrected in an encoded codeword, providing an improvement in data recovery.

32 Claims, 4 Drawing Sheets

OTHER PUBLICATIONS

Chien, R, "Burst-Correcting Codes with High-Speed Decoding", IEEE Transactions on Information Theory, vol. IT-15, No. 1, Jan. 1969, pp. 109-113.*

Burton, H., "Some Asymptotically Optimal Burst-Correcting Codes and Their Relation to Single-Error-Correcting Reed-Solomon Codes", IEEE Transactions on Information Theory, vol. IT-17, No. 1, Jan. 1971, pp. 92-95.*

Mandelbaum, D., "An Application of Cyclic Coding to Message Identification", IEEE Transactions on Communication Technology, vol. COM-17, No. 1, Feb. 1969, pp. 42-48.*

Hsu, H., "A Class of Shortened Cyclic Codes for a Compound Channel", IEEE Transactions on Information Theory, Jan. 1974, pp. 129-131.*

Varaiya, R., "On Ensuring Data Recoverability by the Use of Error-Correcting Codes", IEEE Transactions on Magnetics, vol. MAG-14, No. 4, Jul. 1978, pp. 207-209.*

Blahut, R., "Algebraic Fields, Signal Processing, and Error Control", Proceedings of the IEEE, vol. 73, No. 5, May 1985, pp. 874-893.*

Sublatash, M., "An Error-Correcting Coding Scheme for Teletext and Other Transparent Data Broadcasting", IEEE Transactions on Broadcasting, vol. 36, No. 1, Mar. 1990, pp. 65-73.*

Sweeney, P., "Cyclic Block Codes Definable Over Multiple Finite Fields", Electronics Letters, Mar. 2, 1995, vol. 31, No. 5, pp. 344-346.*

Kamali, B., "Error Control Coding", IEEE Potentials, Apr./May 1995, pp. 15-19.*

R.E. Blahut, "Theory and Practice of Error Control Codes," Addison-Wesley, 1983.

* cited by examiner

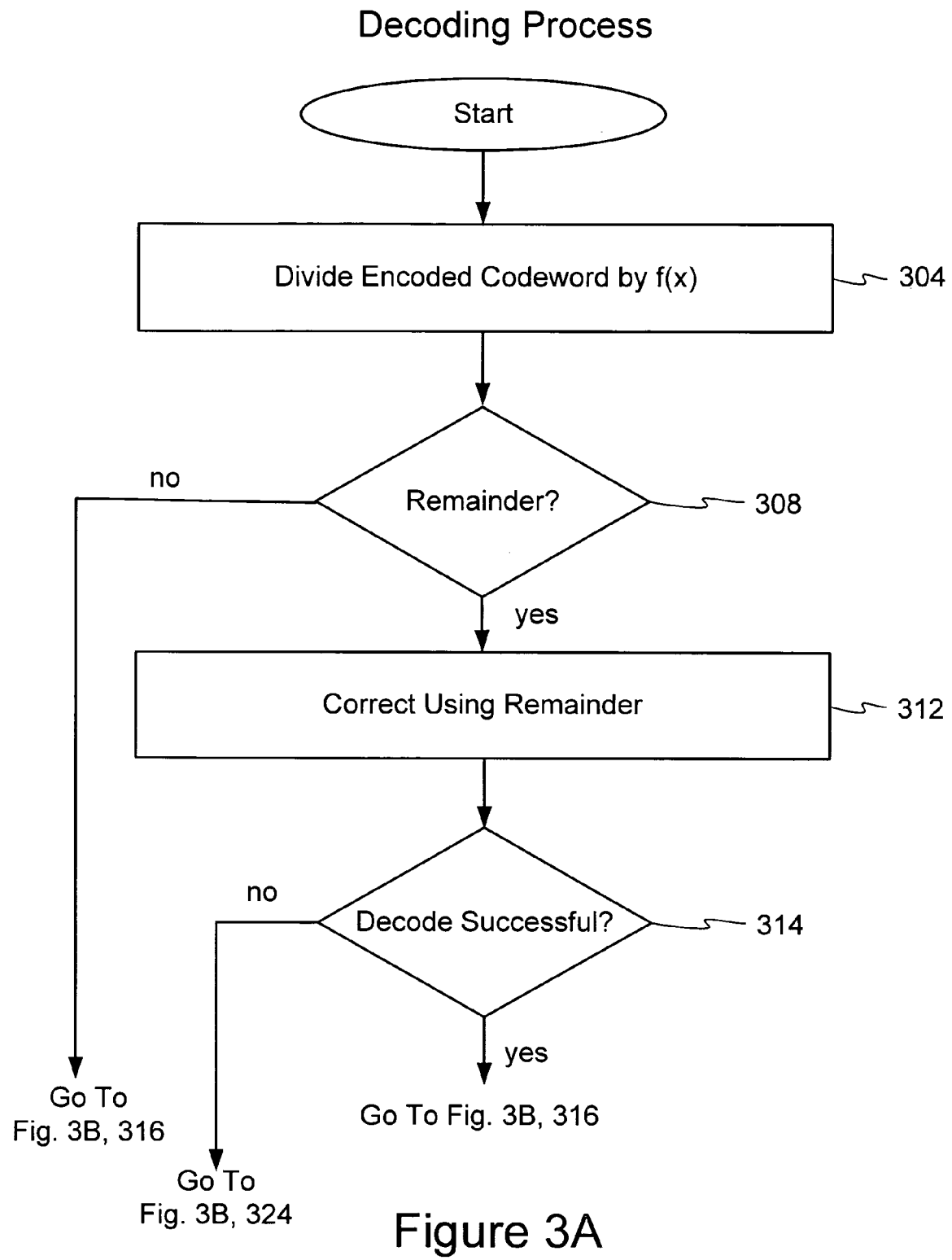

DATA RETRIEVAL FROM A STORAGE DEVICE USING A COMBINED ERROR CORRECTION AND DETECTION APPROACH

BACKGROUND OF THE INVENTION

The basis of error detection and error correction of data stored in storage devices relies in the incorporation of redundant information to the data. The redundant information (also known as parity or redundancy symbols) is used by special hardware and/or software to detect and correct errors in order to recover missing or corrupt data within a media of the storage device. The data residing in a storage device, such as a magnetic disk drive, is encoded using two types of codes: an error correction code (ECC) and an error detection code (EDC). ECCs are used to correct errors while EDCs are used to detect errors in data as it is read from the storage device. Unfortunately, in many instances, such ECCs and EDCs utilize algorithms, implemented either in hardware or firmware, that are incapable of recovering the data in the storage device.

When employing ECC and EDC to data stored in a magnetic disk drive, the number of errors (e.g., symbols errors) capable of being corrected in a sector of data is limited to a specific maximum number. Unfortunately, when the number of such errors exceeds this maximum number, the data associated with this sector may not be readable. As a consequence, critical data may never be recovered from the magnetic disk drive.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Aspects of the invention provide for a more effective method and system of reading data stored in a media of a storage device by way of correcting and detecting errors using a three stage decoding process.

In one embodiment, a method of encoding data stored in a storage device comprises generating a first polynomial whose roots comprise one or more powers of a primitive element of a Galois field, generating a second polynomial whose roots comprise one or more powers of a primitive element of the Galois field and generating a product of the first polynomial and the second polynomial.

In one embodiment, a method of decoding data stored in a storage device comprises reading an encoded codeword from the storage device, performing a first division of the encoded codeword by a first polynomial, determining whether a first remainder exists from the first division, first correcting the encoded codeword using the first remainder, performing a second division of the encoded codeword by a second polynomial, determining whether a second remainder exists from the second division, performing a third division of the encoded codeword by a product of the first and the second polynomials if the second remainder exists from the second division, determining a third remainder from the third division, and second correcting the encoded codeword using the third remainder.

In one embodiment, a method of error correction and detection of data stored in a storage device comprises generating a first polynomial whose roots comprise one or more consecutive powers of a primitive element of a Galois field, generating a second polynomial whose roots comprise one or more consecutive powers of a primitive element of the Galois field, and generating a product of the first polynomial and the second polynomial. Subsequently, a first division is performed on a third polynomial by the product to generate a first remainder wherein the first remainder is used to generate an encoded codeword, wherein the third polynomial is used to represent a sector of data, in which the sector of data comprises a number of symbols. Subsequently the encoded codeword is written into a media of the storage device. The method of error detection and correction further comprises reading the encoded codeword from the storage device, performing a second division of the encoded codeword by the first polynomial, determining whether a second remainder exists from the second division, correcting the encoded codeword using the second remainder, performing a third division of the encoded codeword by the second polynomial, determining whether a third remainder exists from the third division, performing a fourth division of the encoded codeword by a product of the first and the second polynomials if the third remainder exists from the second division, determining a fourth remainder from the fourth division, and correcting the encoded codeword using the fourth remainder.

In one embodiment, a system to effectively correct and detect errors in a media of a storage device comprises an encoder for encoding data that is written onto the media of the storage device, a decoder for decoding the data that is read from the media of the storage device using a process that utilizes at least two stages of error correction.

These and other advantages, aspects, and novel features of the present invention, as well as details of illustrated embodiments, thereof, will be more fully understood from the following description and drawings.

BRIEF DESCRIPTION OF THE DRAWINGS

FIGS. 3A and 3B are flow diagrams of a decoding process used to decode an encoded codeword in accordance with an embodiment of the invention.

DETAILED DESCRIPTION OF THE INVENTION

Aspects of the invention provide for a more effective method and system of retrieving data stored in a media of a storage device by way of correcting and detecting errors using a multi-stage decoding process. In one embodiment, the storage device comprises a magnetic hard drive. The data errors are corrected and detected when reading the data from the storage device. In one embodiment of the present invention, error correction and detection is performed by way of the Reed-Solomon code. In one embodiment, the system and method applies an encoding/decoding technique that allows error correction and detection to be performed over a number of successive decode stages or processing stages. In one embodiment, three successive (decode) processing stages are implemented. In one embodiment, at least two error correction processing stages are implemented. Use of the system and method increases the maximum number of symbol errors that may be corrected in an encoded codeword, providing an improvement in data recovery.

Figure 1:
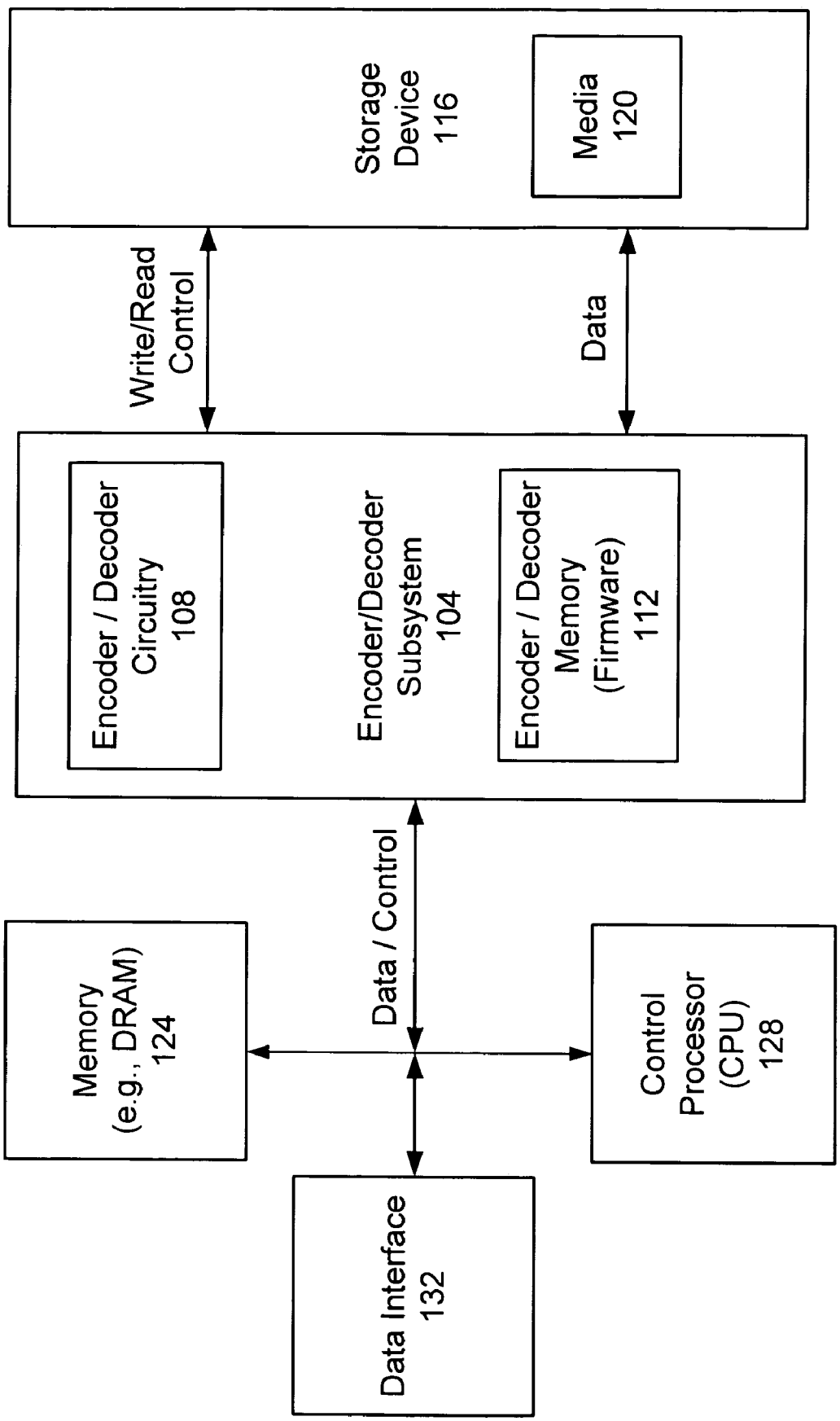
FIG. 1 is a block diagram of an error correction and detection system in accordance with an embodiment of the invention.

FIG. 1 is a block diagram of an error correction and detection system in accordance with an embodiment of the invention. The system comprises an encoder/decoder subsystem 104, a storage device 116, a memory 124, a control processor (CPU) 128, and a data interface 132. The encoder/decoder subsystem 104 comprises an encoder/decoder circuitry 108 and an encoder/decoder memory 112. The encoder/decoder circuitry 108 may comprise digital logic circuitry capable of encoding data it receives from the data interface 132. In addition, the encoder/decoder memory 112 may store a set of instructions, software, or firmware capable of performing encoding and decoding of data it receives from one or more devices (e.g., the data interface 132, storage device 116, memory 124, CPU 128). The encoding and decoding of data performed by encoder/decoder circuitry 108 may be facilitated by executing one or more instructions resident within the encoder/decoder memory 112. In one embodiment, the encoder/decoder memory 112 may store a set of instructions resident in the encoder/decoder memory 112 capable of encoding and decoding data using one or more algorithms. The one or more algorithms may be implemented when the CPU executes the set of instructions. The one or more algorithms implemented may comprise, for example, the encoding and/or decoding algorithms that will be described in FIGS. 2, 3A, and 3B. The encoder/decoder memory 112 may comprise a read only memory (ROM) such as a programmable read only memory (PROM). In one embodiment, the encoder/decoder circuitry 108 and/or the encoder/decoder memory 112 may implement a Reed-Solomon encoder/decoder. For example, the encoder/decoder circuitry 108 and/or the encoder/decoder memory 112 may generate a number of encoded codewords, such as Reed-Solomon codewords, after receiving data from the data interface 132. When the encoder/decoder subsystem 104 writes to the storage device 116, one or more appropriate write control signals are transmitted to the storage device 116. On the other hand, when the encoder/decoder subsystem 104 reads from the storage device 116, one or more appropriate control signals are transmitted to the storage device 116. In both a write or read operation, data is transmitted between the encoder/decoder subsystem 104 and the storage device 116. The storage device 116 writes into or reads from a media 120. The media 120 resides within the storage device 116 and may comprise a removable or portable media 120. The media 120 may comprise a magnetic media such as that found in a magnetic disk drive. The media 120 stores one or more encoded codewords generated by the encoder/decoder subsystem 104. The memory 124 may be used by the encoder/decoder subsystem 104 and the control processor 128 for storing and manipulating data during the encoding and decoding process. It is contemplated the memory 124 may comprise random access memory (RAM) such as dynamic RAM (DRAM).

Each of the encoded codewords generated by the encoder/decoder subsystem 104 comprises a number of symbols. Each symbol comprises any number of bits. In one embodiment, the number of bits in a symbol equals 10 while the maximum number of symbols in an encoded codeword equals 1023. The data received by the encoder/decoder subsystem is partitioned into one or more sectors of data. Each sector of data may be represented by an encoded codeword. The encoded codeword comprises one or more data symbols and one or more redundancy or parity symbols. The redundancy or parity symbols may be appended after the one or more data symbols. The redundancy or parity symbols may comprise symbols generated by an exemplary Reed-Solomon encoder.

In one embodiment, if n denotes the number of data and parity symbols in an encoded codeword (required to represent the sector of data), the number of parity symbols used in the encoded codeword is equal to 2(t+k). In one embodiment, the error correction and detection system generates a first polynomial of degree 2 t and a second polynomial of degree 2 k. The roots of the first polynomial as well as the roots of the second polynomial comprise consecutive powers of a primitive element of a Galois field. In one embodiment, the first root of the second polynomial has power that is consecutive to that of the last root of the first polynomial. Mathematically, the previously described relationships may be represented by the following equations:

$$p(x)=(x-\alpha^1) \ldots (x-\alpha^{2k}) \qquad \text{[first polynomial]}$$

$$f(x)=(x-\alpha^{2k+1}) \ldots (x-\alpha^{2(t+k)}) \qquad \text{[second polynomial]}$$

As described by the previous equations, the primitive element of the Galois field is represented by $\alpha$. The encoder/decoder subsystem 104 utilizes a third polynomial, termed the generator polynomial, which corresponds to the product of the first polynomial, p(x), and the second polynomial, f(x). The generator polynomial, g(x), may be represented by the following equation:

$$g(x)=p(x)f(x)=(x-\alpha^1) \ldots (x-a^{2(t+k)}) \qquad \text{[third polynomial]}$$

The one or more data symbols, $c_{2(t+k)}$, $c_{2(t+k)+1}$, ..., $c_{n-1}$ of the codeword may be represented by the following equation:

$$C(x)=c_{2(t+k)}x^{2(t+k)}+c_{2(t+k)+1}x^{2(t+k)+1}+\ldots+c_{n-1}x^{n-1}$$

After C(x) is divided by g(x), the remainder that results provides the one or more parity symbols of the encoded codeword. The remainder polynomial, r(x), of degree 2(t+k)−1, may be represented by the following equation:

$$r(x)=r_0+r_1x+\ldots+r_{2(t+k)-1}x^{2(t+k)-1}$$

The encoded codeword (e.g., the one or more data and parity symbols) is generated by appending r(x) to C(x) and may be represented by the following equation.

$$C^*(x)=C(x)+r(x)=r_0+r_1x+\ldots+r_{2(t+k)-1}x^{2(t+k)-1}+c_{2(t+k)}x^{2(t+k)}+c_{2(t+k)+1}x^{2(t+k)+1}+\ldots+c_{n-1}x^{n-1}$$

As shown, the coefficients of C*(x) represent a total of n symbols.

Figure 2:
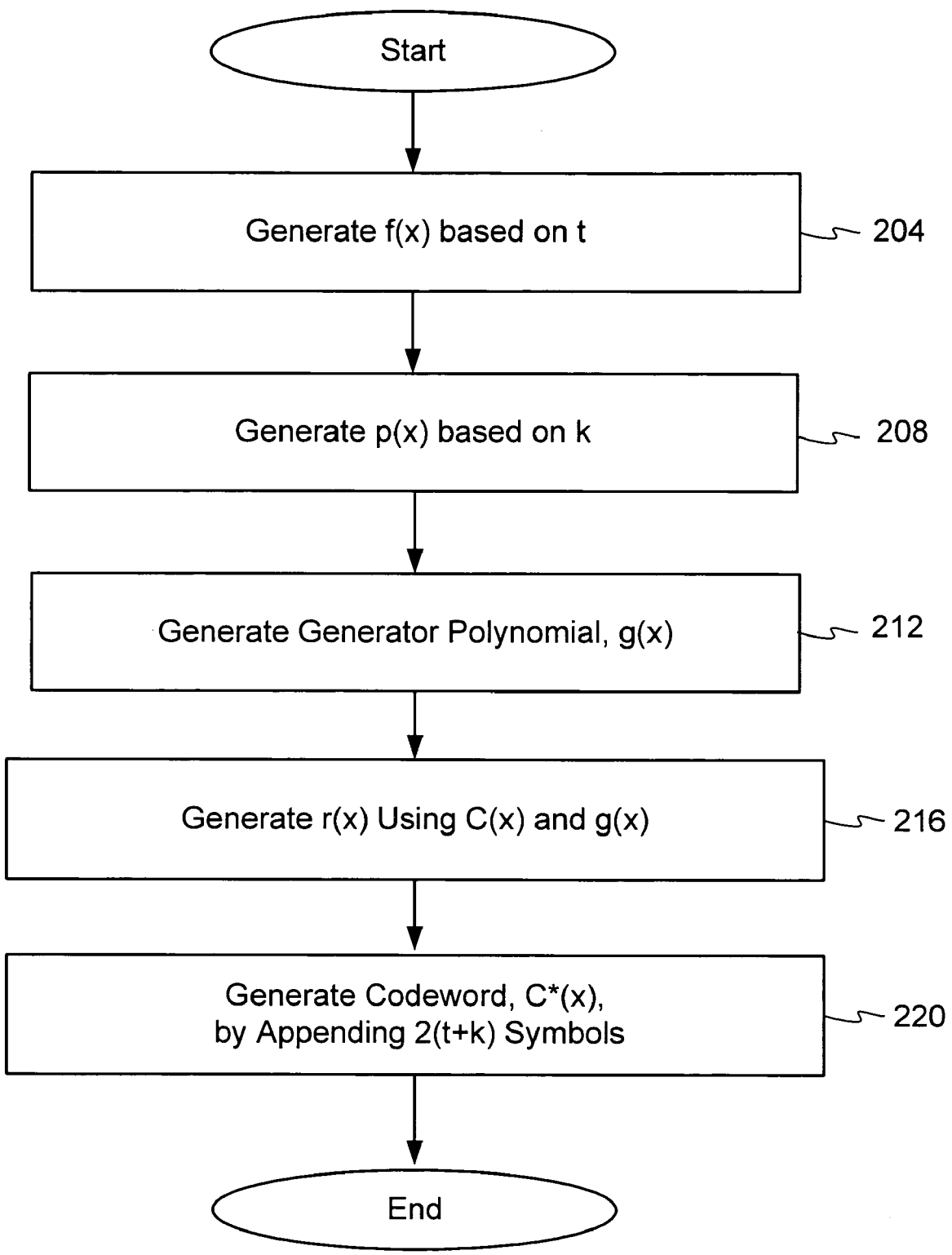
FIG. 2 is a flow diagram of an encoding process used to generate an encoded codeword in accordance with an embodiment of the invention.

FIG. 2 is a flow diagram of an encoding process or encoding algorithm used to generate an encoded codeword in accordance with an embodiment of the invention. The encoding process or algorithm utilizes the polynomial equations, f(x), p(x), g(x), r(x), C(x), and C*(x) previously described, each of which are defined over a Galois field. The encoding algorithm utilizes a process such that decoding may be performed sequentially over multiple processing stages, as will be described later in FIGS. 3A and 3B, for example. The encoding process starts at step 204, in which, f(x) is determined based on t. The encoder/decoder subsystem, as referenced in FIG. 1, generates f(x) as a polynomial of degree 2t having roots which are consecutive powers of a primitive element in a Galois field. The variable t defines the maximum number of symbol errors capable of being corrected by the error correction and detection system shown in FIG. 1 when the polynomial f(x) is used. In one embodiment, the variable t+k is defined as one-half the difference between the total number of symbols in a codeword and the number of data symbols in the codeword. As described earlier, f(x) comprises a polynomial of degree 2 t. In one embodiment, t=24 or 2 t=48. At step 208, the encoder/decoder subsystem generates p(x) as a polynomial of degree 2 k, in which its roots are consecutive powers of the same primitive element. In one embodiment, k=2 or 2 k=4. The variable k defines the maximum number of symbol errors capable of being corrected by the error correction and detection system shown in FIG. 1 when the polynomial p(x) is used. In one embodiment, the polynomials f(x) and p(x) are pre-computed and implemented at the time of manufacture (e.g., at the time the error correction and detection system, as described in FIG. 1, is built or manufactured). For example, α and the orders of f(x) and p(x) are determined only once, at the time the error correction and detection system is built. At step 212, the encoder/decoder subsystem generates the generator polynomial, g(x). As described earlier, g(x) is the product of f(x) and p(x). The polynomials, f(x), p(x), and g(x) may be defined and generated by way of a Reed-Solomon code encoder. In one embodiment, the polynomial g(x) is predetermined since, as described previously, f(x) and p(x) are pre-computed at the time of manufacture. At step 216, the remainder polynomial, r(x), is generated by dividing C(x) using g(x). The remainder polynomial, r(x), contains 2(t+k) parity or redundancy terms. Then at step 220, the encoded codeword, C*(x) is generated by appending the 2(t+k) parity or redundancy symbols to the data portion of the codeword, C(x). C(x) is a polynomial defined over a Galois field whose coefficients represent one or more data symbols. Thereafter, the encoded codeword, C*(x), may be written into a media of a storage device such as an exemplary magnetic disk drive. C*(x) is a polynomial defined over a Galois field whose coefficients represent one or more data and parity (or redundancy) symbols. Aspects of the invention provide for the computation of C*(x), for each C(x) received by the error correction and detection system, using the pre-computed values for f(x) and p(x). In one operational embodiment, each of the one or more symbols represented by C(x) and C*(x) comprise 10 bits.

Figure 3B:
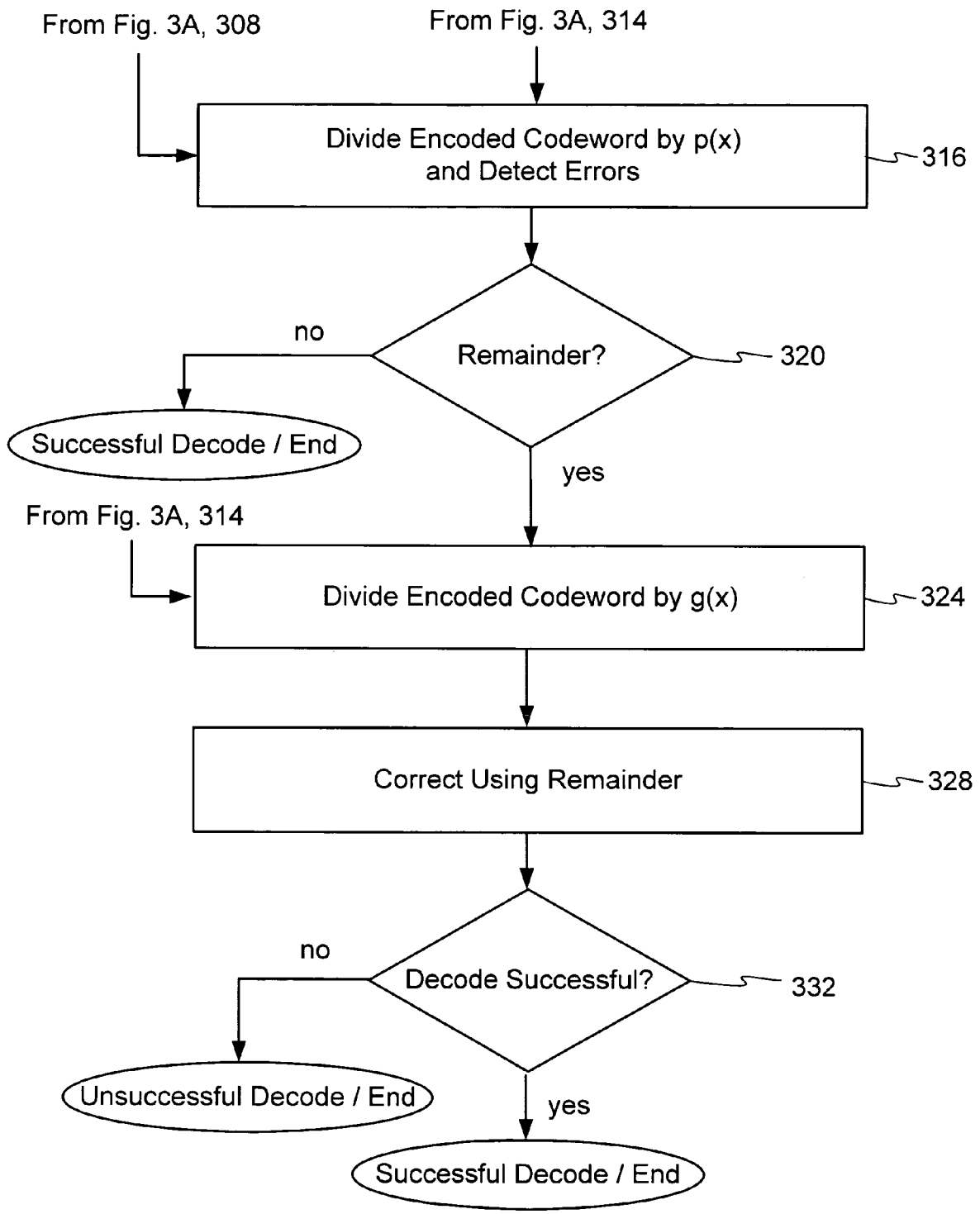

FIGS. 3A and 3B are flow diagrams of a decoding process or decoding algorithm used to decode an encoded codeword in accordance with an embodiment of the invention. The decoding process or algorithm utilizes the polynomial equations, f(x), p(x), g(x), r(x), C(x), and C*(x) previously described. The decoding algorithm utilizes at least two error correction stages in order to more effectively correct symbol errors when reading data from media of a storage device. In one embodiment, the decoding algorithm utilizes a 3 stage decoding process in which 1) a first error correction is performed at the first processing stage using f(x), 2) an error detection check is performed at the second processing stage using p(x), and 3) a second error correction is performed at the third processing stage using g(x). The first processing stage occurs at step 304, in which the encoded codeword, C*(x), is divided by the polynomial f(x) described in relation to FIG. 2. At step 308, the decoder circuitry determines if a remainder exists after C*(x) is divided by f(x). If a remainder exists, the process proceeds to step 312, in which up to t symbol errors are corrected. Otherwise, if no remainder exists, the process proceeds to step 316, in order to perform an error check. During the first processing stage, the encoded codeword, C*(x), is corrected for up to a maximum of t errors, by way of utilizing the remainder. In one embodiment, a Reed-Solomon algorithm is used to correct up to t errors in the encoded codeword, C*(x). (C*(x) is divisible by g(x), so it is also divisible by f(x), in which f(x) has degree 2 t; as a result, the first processing stage utilizes this fact to correct up to t symbol errors). At step 314, the decoder determines whether the encoded codeword has been successfully decoded. If the encoded codeword has not been successfully decoded, the process proceeds with step 324. Otherwise, the process proceeds with step 316, in which an error detection check is performed. The second processing stage occurs at step 316, in which the encoded codeword is divided by polynomial p(x), in order to perform an error detection check. The one or more symbol error(s) that are corrected at step 312 may be verified by way of the error detection check. If, at step 320, it is determined that a remainder exists after division by p(x), one or more errors still remain present in the encoded codeword C*(x), and the process proceeds with step 324. The second processing stage determines whether any errors exist after processing is performed at the first processing stage, as described above. However, if, at step 320, there is no remainder after division by p(x), all errors in C*(x) have been corrected and the process ends with a successful decode. In one embodiment, the error detection provided by the second processing stage is implemented using a Reed-Solomon algorithm employing 2 k parity or redundancy symbols. If a remainder exists after division by p(x), the process proceeds with the third processing stage at step 324, in which, the encoded codeword, C*(x), is divided by the generator polynomial, g(x), as described in reference to FIG. 2. As described previously, the generator polynomial g(x) has degree equal to 2(t+k). At step 324, it is determined whether a remainder exists after dividing by g(x). If a remainder exists, at step 328, the remainder is used to correct up to (t+k) symbol errors in C*(x). In one embodiment, a Reed-Solomon algorithm is used to correct up to (t+k) errors in C*(x). C*(x) is divisible by g(x), in which g(x) has degree 2(t+k). As a consequence, the third processing stage utilizes this fact to correct up to (t+k) symbol errors. The error correction capability provided when dividing by g(x) allows error correction for up to a maximum of (t+k) errors. At step 332, it is determined whether a successful decode may be accomplished. If the data cannot be decoded, an unsuccessful decode or failure occurs and the process ends. Otherwise, a successful decode results, and the process ends. It is contemplated that the error correction and detection process previously described may be implemented using a number of stages beyond the 3 stage process described, in order to provide additional error correction/detection capabilities.

Alternatively, in another embodiment of the above described encoding/decoding process, a modification of a write or a read operation is performed in order to obviate an issue in which a read operation encounters a displaced sync mark an integer number of symbols before or after an actual sync mark location. In one embodiment, a cyclic shift in an encoded codeword, resulting from such a displaced sync mark, may result in another valid codeword, for example, when a Reed-Solomon codeword is used. A symbol (or byte, when symbol comprises 8 bits) number is added to the corresponding symbol (or byte) value. For example, the following mapping is performed after the previously described encoding, but prior to writing the encoded codeword onto a media of a storage device:

$$c^* \to c^*_j + j, j = 0, \ldots, n-1$$

Here, c* represents the symbol while j represents the symbol number. In this embodiment, when reading data from a media of a storage device, the mapping is performed prior to performing a decode of the encoded codeword, in order to correctly read the data.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A method of encoding data stored in a storage device comprising:
    generating a first polynomial whose roots comprise one or more powers of a primitive element of a Galois field;
    generating a second polynomial whose roots comprise one or more powers of a primitive element of said Galois field;

generating a product of said first polynomial and said second polynomial;

dividing a third polynomial by said product to generate an encoded codeword, said third polynomial used to represent a sector of data, said sector of data comprising a number of symbols;

writing said encoded codeword onto a media of said storage device; and decoding data stored in said storage device comprising:
reading said encoded codeword from said storage device;
performing a first division of said encoded codeword by said first polynomial;
determining whether a first remainder exists from said first division;
first correcting said encoded codeword using said first remainder;
performing a second division of said encoded codeword by said second polynomial;
determining whether a second remainder exists from said second division;
performing a third division of said encoded codeword by said product of said first and said second polynomials if said second remainder exists from said second division;
determining a third remainder from said third division; and
second correcting said encoded codeword using said third remainder.

2. The method of claim 1 wherein said encoded codeword is generated by dividing a fourth polynomial by said product of said first and second polynomials, said fourth polynomial having coefficients that represent one or more data symbols, said fourth polynomial defined over a Galois field.

3. The method of claim 1 wherein said first correcting corrects a maximum number of symbol errors equal to one-half the degree of said first polynomial.

4. The method of claim 1 wherein said second correcting corrects a maximum number of symbol errors equal to one-half the degree of said product of said first polynomial and said second polynomial.

5. The method of claim 1 wherein one or more roots of said first polynomial are consecutive powers of a primitive element of said Galois field.

6. The method of claim 5 wherein one or more roots of said second polynomial are consecutive powers of a primitive element of said Galois field.

7. The method of claim 6 wherein each of said one or more roots of said first polynomial is not equal to each of said one or more roots of said second polynomial.

8. The method of claim 7 wherein the first root of said one or more roots of said second polynomial has power that is consecutive to that of the last root of said one or more roots of said first polynomial.

9. A method of encoding and decoding data stored in a media of a storage device comprising:
generating a first polynomial whose roots comprise one or more consecutive powers of a primitive element of a Galois field;
generating a second polynomial whose roots comprise one or more consecutive powers of a primitive element of said Galois field;
generating a product of said first polynomial and said second polynomial;
performing a first division of a third polynomial by said product to generate a first remainder, said first remainder used to generate an encoded codeword, said third polynomial used to represent a sector of data, said sector of data comprising a number of data symbols;
writing said encoded codeword into said media of said storage device;
reading said encoded codeword from said storage device;
performing a second division of said encoded codeword by said first polynomial;
determining whether a second remainder exists from said second division;
correcting said encoded codeword using said second remainder;
performing a third division of said encoded codeword by said second polynomial;
determining whether a third remainder exists from said third division;
performing a fourth division of said encoded codeword by a product of said first and said second polynomials if said third remainder exists from said third division;
determining a fourth remainder from said fourth division; and
correcting said encoded codeword using said fourth remainder.

10. The method of claim 9 wherein said first polynomial is of degree 48.

11. The method of claim 9 wherein said second polynomial is of degree 4.

12. The method of claim 9 wherein said encoding and decoding is implemented by way of Reed-Solomon codes.

13. The method of claim 9 wherein said storage device comprises a magnetic disk drive.

14. The method of claim 9 wherein said symbols comprise 10 bits.

15. The method of claim 14 wherein said encoded codeword comprises a maximum length of 1023 symbols.

16. A method of encoding data stored in a storage device comprising:
generating a first polynomial whose roots comprise one or more powers of a primitive element of a Galois field, said first polynomial capable of being used to perform a first error correction of an encoded codeword, said first error correction correcting up to a first number of errors equal to one-half the degree of said first polynomial;
generating a second polynomial whose roots comprise one or more powers of a primitive element of said Galois field, said second polynomial capable of being used to perform an error detection check of said encoded codeword; and
generating a product of said first polynomial and said second polynomial to yield a third polynomial, said third polynomial used to generate said encoded codeword, said third polynomial capable of being used to perform a second error correction of said encoded codeword, said second error correction correcting up to a second number of errors equal to one-half the degree of said third polynomial, wherein the degree of said first polynomial equals 48.

17. A method of encoding data stored in a storage device comprising:
generating a first polynomial whose roots comprise one or more powers of a primitive element of a Galois field, said first polynomial capable of being used to perform a first error correction of an encoded codeword, said first error correction correcting up to a first number of errors equal to one-half the degree of said first polynomial;
generating a second polynomial whose roots comprise one or more powers of a primitive element of said Galois field, said second polynomial capable of being used to perform an error detection check of said encoded codeword; and generating a product of said first polynomial and said second polynomial to yield a third polynomial, said third polynomial used to generate said encoded codeword, said third polynomial capable of being used to perform a second error correction of said encoded codeword, said second error correction correcting up to a second number of errors equal to one-half the degree of said third polynomial, wherein the degree of said second polynomial equals 4.

18. A system comprising:
a storage device; and
an encoder/decoder subsystem used for:
   generating a first polynomial whose roots comprise one or more powers of a primitive element of a Galois field;
   generating a second polynomial whose roots comprise one or more powers of a primitive element of said Galois field;
   generating a product of said first polynomial and said second polynomial;
   dividing a third polynomial by said product to generate an encoded codeword, said third polynomial used to represent a sector of data, said sector of data comprising a number of symbols;
   writing said encoded codeword onto a media of said storage device;
   decoding data stored in said storage device comprising:
      reading said encoded codeword from said storage device;
      performing a first division of said encoded codeword by said first polynomial;
      determining whether a first remainder exists from said first division;
      first correcting said encoded codeword using said first remainder;
      performing a second division of said encoded codeword by said second polynomial;
      determining whether a second remainder exists from said second division;
      performing a third division of said encoded codeword by said product of said first and said second polynomials if said second remainder exists from said second division;
      determining a third remainder from said third division; and
      second correcting said encoded codeword using said third remainder.

19. The system of claim 18 wherein said encoded codeword is generated by dividing a fourth polynomial by said product of said first and second polynomials, said fourth polynomial having coefficients that represent one or more data symbols, said fourth polynomial defined over a Galois field.

20. The system of claim 18 wherein said first correcting corrects a maximum number of symbol errors equal to one-half the degree of said first polynomial.

21. The system of claim 18 wherein said second correcting corrects a maximum number of symbol errors equal to one-half the degree of said product of said first polynomial and said second polynomial.

22. The system of claim 18 wherein one or more roots of said first polynomial are consecutive powers of a primitive element of said Galois field.

23. The system of claim 22 wherein one or more roots of said second polynomial are consecutive powers of a primitive element of said Galois field.

24. The system of claim 23 wherein each of said one or more roots of said first polynomial is not equal to each of said one or more roots of said second polynomial.

25. The system of claim 24 wherein the first root of said one or more roots of said second polynomial has power that is consecutive to that of the last root of said one or more roots of said first polynomial.

26. A system comprising:
a storage device used for writing said encoded codeword onto a media of said storage device; and
an encoder/decoder subsystem used for:
   generating a first polynomial whose roots comprise one or more consecutive powers of a primitive element of a Galois field;
   generating a second polynomial whose roots comprise one or more consecutive powers of a primitive element of said Galois field;
   generating a product of said first polynomial and said second polynomial;
   performing a first division of a third polynomial by said product to generate a first remainder, said first remainder used to generate an encoded codeword, said third polynomial used to represent a sector of data, said sector of data comprising a number of data symbols;
   writing said encoded codeword into said media of said storage device;
   reading said encoded codeword from said storage device;
   performing a second division of said encoded codeword by said first polynomial;
   determining whether a second remainder exists from said second division;
   correcting said encoded codeword using said second remainder;
   performing a third division of said encoded codeword by said second polynomial;
   determining whether a third remainder exists from said third division;
   performing a fourth division of said encoded codeword by a product of said first and said second polynomials if said third remainder exists from said third division;
   determining a fourth remainder from said fourth division; and
   correcting said encoded codeword using said fourth remainder.

27. The system of claim 26 wherein said first polynomial is of degree 48.

28. The system of claim 26 wherein said second polynomial is of degree 4.

29. The system of claim 26 wherein said symbols comprise 10 bits.

30. The system of claim 26 wherein said encoded codeword comprises a maximum length of 1023 symbols.

31. The system of claim 26 wherein encoding and decoding of said codeword is implemented by way of Reed-Solomon codes.

32. The system of claim 26 wherein said storage device comprises a magnetic disk drive.

* * * * *